(12) United States Patent
Stegers et al.

(10) Patent No.: US 7,272,159 B1
(45) Date of Patent: Sep. 18, 2007

(54) APPARATUS AND METHOD FOR A LASERDIODE DRIVER WITH A DISTRIBUTED CURRENT MIRROR

(75) Inventors: Marc Gerardus Maria Stegers, Rotterdam (NL); Mark Vincent van Beek, Rijswijk (NL); Rudy Eschauzier, Bergschenhoek (NL); Wouter Anton Serdijn, Leiden (NL)

(73) Assignee: National Semiconductor Corporation, Santa Clara, CA (US)

( * ) Notice: Subject to any disclaimer, the term of this patent is extended or adjusted under 35 U.S.C. 154(b) by 296 days.

(21) Appl. No.: 11/007,890

(22) Filed: Dec. 8, 2004

(51) Int. Cl.
*H01S 3/00* (2006.01)
(52) U.S. Cl. .................. 372/38.02; 372/38.07
(58) Field of Classification Search ............. 372/38.02, 372/38.07
See application file for complete search history.

(56) References Cited

U.S. PATENT DOCUMENTS

| 5,898,334 | A | 4/1999 | Fairgrieve |
| 2002/0118629 | A1* | 8/2002 | Suzuki et al. ............... 369/116 |
| 2003/0030873 | A1* | 2/2003 | Hietala et al. .............. 359/181 |
| 2004/0131362 | A1* | 7/2004 | Giaretta et al. ............. 398/135 |
| 2006/0133250 | A1* | 6/2006 | Chou et al. ............... 369/53.26 |

* cited by examiner

*Primary Examiner*—Nguyen (Michael) Dung
(74) *Attorney, Agent, or Firm*—Darby & Darby PC; Matthew M. Gaffney (57) ABSTRACT

A LDD that includes write channels and a distributed output current mirror is provided. The distributed output current mirror includes a current mirror for each of the write channels. For each write channel, if the write channel is enabled, it provides a current to the corresponding current mirror. The outputs of each of the current mirrors are coupled together to provide the output current to the laserdiode.

20 Claims, 5 Drawing Sheets

APPARATUS AND METHOD FOR A LASERDIODE DRIVER WITH A DISTRIBUTED CURRENT MIRROR

FIELD OF THE INVENTION

The invention is related to drivers, and in particular, to a laserdiode driver circuit that includes a distributed current mirror.

BACKGROUND OF THE INVENTION

Laserdiodes (LDs) may be used for compacts discs (CDs), other types of optical discs, laser scanners, and other applications. Like a light-emitting diode (LED), a LD employs a forward-biased p-n junction to generate light through electron-hole recombination. However, in an LED, photons are emitted by a process called spontaneous emission.

In contrast, LDs are capable of generating laser beams because they are designed to amplify light through an emission process referred to as stimulated emission. Stimulated emission occurs in a LD because a LD includes a cavity in which some of the surfaces are mirrored. The cavity is referred to as an "optical cavity". When photons are emitted from the LD, most of the photons are reflected by the optical cavity, causing the photon density in the optical cavity to increase. In stimulated emission, each electron-hole pair recombines in the presence of a photon of the correct wavelength. When the electron-hole pair recombines, a photon is emitted having the same phase as the photon causing the emission. Accordingly, the photon emission for photons of the selected wavelength increases, and the electron-hole pair recombination rate increases.

A LD driver (LDD) is typically used to drive a LD. The LDD provides an output current to drive the LD. In response to the output current, the LD provides a laser beam, which may be used for reading information from an optical disc, and/or writing optical information to an optical disc.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a LDD that includes write channels and a distributed output current mirror. The distributed output current mirror includes a current mirror for each of the write channels. For each write channel, if the write channel is enabled, it provides a current to the corresponding current mirror. The outputs of each of the current mirrors are coupled together to provide the output current to the laserdiode.

Figure 1:
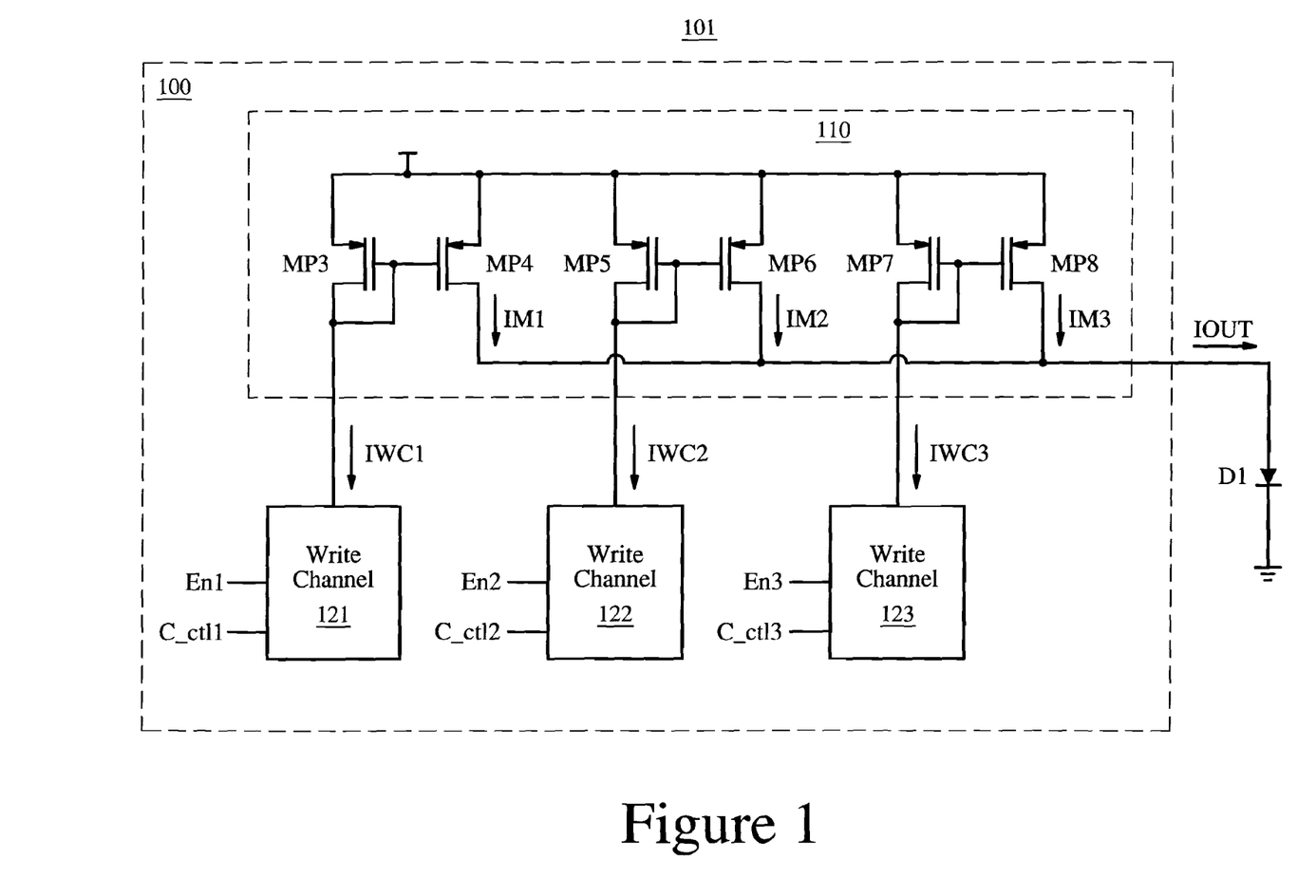
FIG. 1 shows a block diagram of an embodiment of a LDD circuit and a LD.

FIG. 1 shows a block diagram of an embodiment of system 101. An embodiment of system 101 includes LD D1 and LDD circuit 100. An embodiment of LDD circuit 100 includes write channels 121-123 and distributed current mirror 110. An embodiment of distributed current mirror 110 includes transistors MP3-MP8.

In operation, write channel 121 provides write channel current IWC1 if write enable signal En1 is asserted. Similarly, write channel 122 is arranged to provide write channel current IWC2 if write enable signal En2 is asserted, and write channel 123 is arranged to provide write channel current IWC3 if write enable signal En3 is asserted. Write channel 121 is configured such that current IWC1 is adjustable based on signal C_ctl1. Similarly, write channel 122 is configured such that current IWC2 is adjustable based on signal C_ctl2, and write channel 123 is configured such that current IWC3 is adjustable based on signal C_ctl3.

Distributed current mirror 110 is arranged to provide output current IOUT based, in part, on write channel currents IWC1, IWC2, and IWC3.

Transistors MP3 and MP4 are arranged as a current mirror which provides mirror output current IM1 at the drain of transistor MP4 based on current IWC1, which is received at the drain of transistor MP3. Similarly, transistors MP5 and MP6 are arranged as a current mirror which provides mirror output current IM2 at the drain of transistor MP6 based on current IWC2, which is received at the drain of transistor MP5. Also, transistors MP7 and MP8 are arranged as a current mirror which provides mirror output current IM3 at the drain of transistor MP8 based on current IWC3, which is received at the drain of transistor MP7. The outputs of the three current mirrors (i.e. the drains of transistors MP4, MP6, and MP8) are coupled together so that output current IOUT is substantially equal to IM1+IM2+IM3.

Although three write channels are illustrated in FIG. 1, in various embodiments, LDD circuit 100 may have virtually any number (X) of write channels. For typical applications, LDD circuit 100 has two to four write channels.

In general, there are X write channels and X current mirrors. The output of each of the X write channels is coupled to a separate corresponding current mirror. Each of the X write channels provides a mirror output current IM1 through IMX based on the received write channel current IWC1 through IWCX. The outputs of the current mirrors are coupled together to provide current IOUT, so that IOUT is substantially equal to the sum of the mirror output currents IM1 through IMX.

Distributed current mirror 110 may be viewed as an output current mirror that is distributed into X current mirrors, with the output current of each of the X current mirrors summed to form the total output current IOUT.

Additionally, LD D1 is arranged to provide an optical signal in response to current IOUT. In one embodiment, the optical signal is employed to drive an optical disc.

In the embodiment shown in FIG. 1, the transistors in distributed current mirror 110 are field-effect transistors (FETs). In other embodiments, the transistors in distributed current mirror 110 may be a type of transistor other than a FET, such as a bipolar junction transistor (BJT), or the like. Also, the transistors in distributed current mirror 110 are illustrated as p-type transistors in FIG. 1. In other embodiments, the transistors in distributed current mirror 110 may be n-type transistors.

In one embodiment, LDD circuit 100 is included in an integrated circuit (IC), and LD D1 is external to the IC. In other embodiments, other arrangements may be employed.

Figure 2:
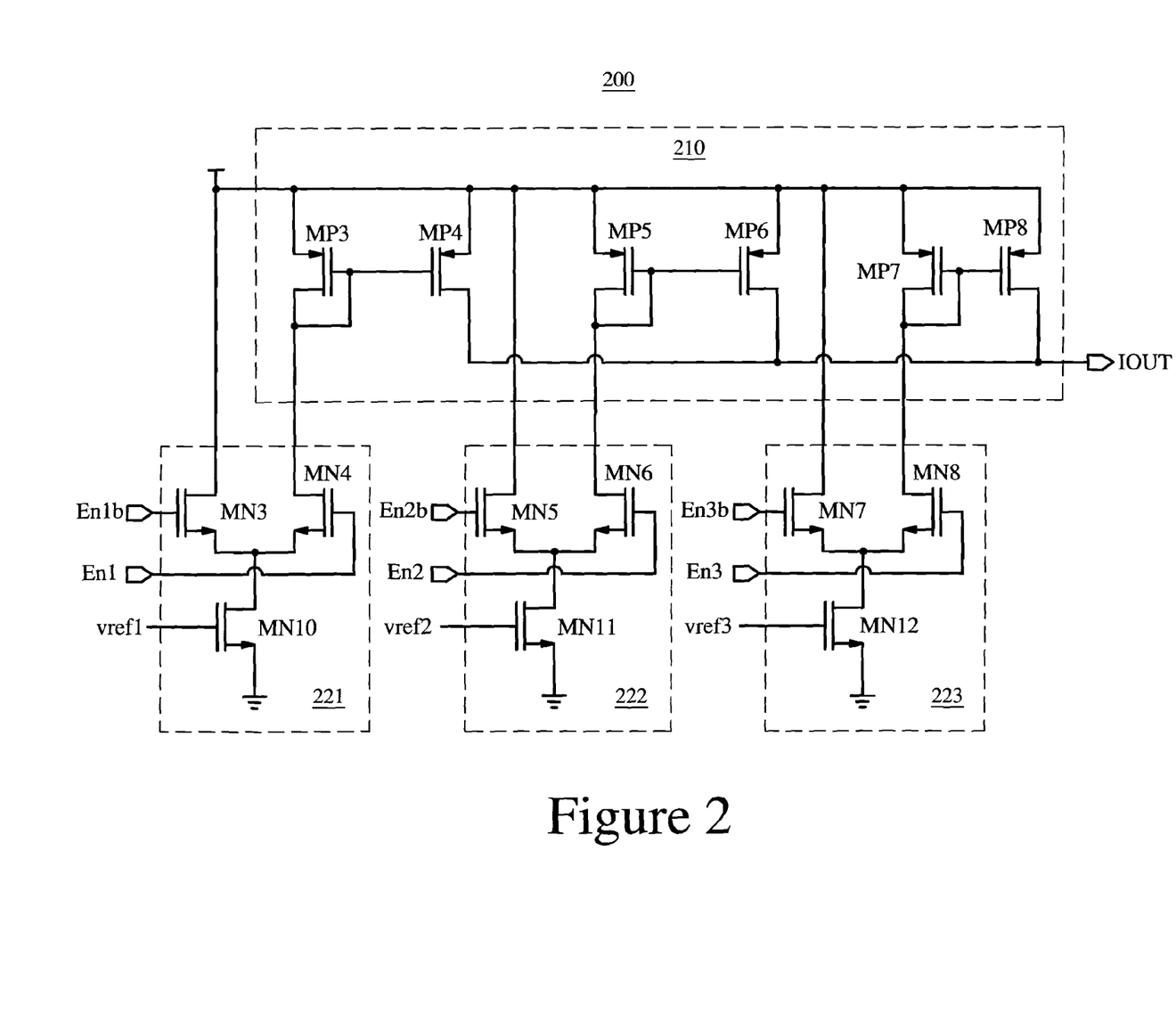
FIG. 2 schematically illustrates an embodiment of the LDD circuit of FIG. 1.

FIG. 2 schematically illustrates an embodiment of LDD circuit 200. An embodiment of LDD circuit 200 may be employed as an embodiment of LDD circuit 100 of FIG. 1. Write channel 221 includes transistors MN3, MN4, and MN10; write channel 222 includes transistors MN5, MN6, and MN11; and write channel 223 includes transistors MN7, MN8, and MN12.

Transistors MN10-MN12 are each configured to operate as an adjustable current source responsive to voltage vref1 through vref3, respectively. Voltages vref1-vref3 are embodiments of signals C_CTL1-C_CTL3 of FIG. 1, respectively. Transistors MN3-MN8 are configured to operate as switch circuits responsive to signals En1b, En1, En2b, En2, En3b, and En3, respectively.

In one embodiment, LDD circuit 200 is included in an IC, and the drain of transistors MP4, MP6, and MP8 are coupled to an output pin of the IC. In one embodiment, the gate of transistors MN4, MN6, and MN8 are each coupled to a separate input pin of the IC. Although not shown in FIG. 2, in one embodiment, voltages vref1-vref3 are each provided from a separate amplifier that provides signal vref1-vref3 respectively. Each of the three amplifiers may be coupled to a separate input pin of the IC.

A switching arrangement for a particular embodiment of LDD driver circuit 200 is illustrated in FIG. 2. However, other switching arrangements may be employed within the scope and spirit of the invention. For example, in one embodiment, rather than employing a differential signal to control each pair of switching, in one embodiment, for each write channel (221-223), one of the switch circuits receives a single-ended signal, and the other switch circuit receives a constant voltage. In another embodiment, there is only one switch circuit in each write channel.

Figure 3:
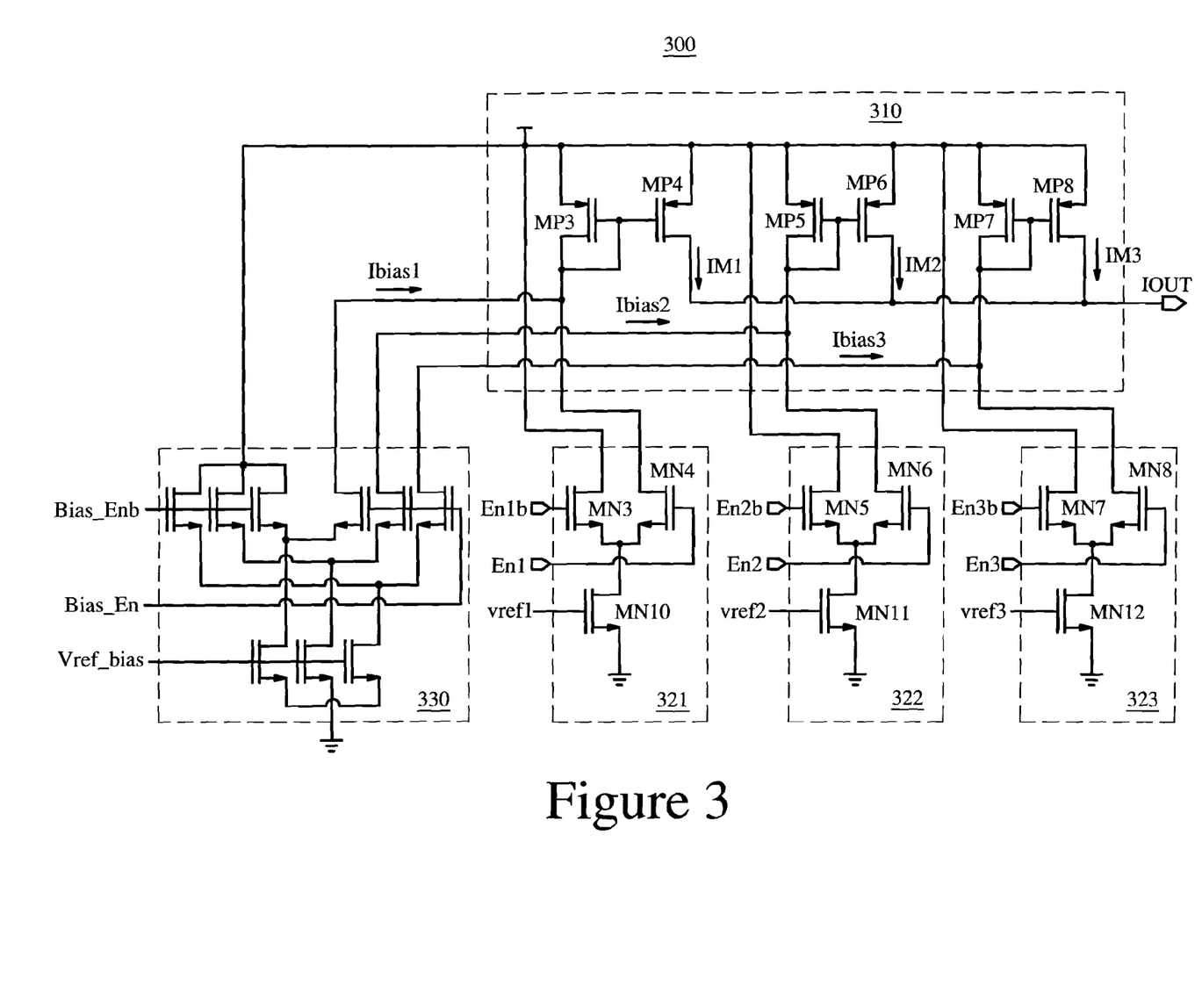
FIG. 3 shows a schematic diagram of an embodiment of the LDD circuit of FIG. 2 which further includes a read channel.

FIG. 3 shows a schematic diagram of an embodiment of LDD circuit 300. LDD circuit 300 may be employed as an embodiment of LDD circuit 200 of FIG. 2. LDD circuit 300 further includes read channel 330.

Read channel 330 includes X (e.g. 3) transistors that are each configured to operate as a current source adjustable based on signal Vref_bias. Each of the X transistors is coupled to a separate pair of transistors that operate as switch circuits, which in turn are each coupled to a separate current mirror in distributed current mirror 310.

Read channel 330 is arranged to bias each of the X current mirrors in distributed current mirror 310 with bias currents Ibias1-IbiasX, respectively. This way, a smaller voltage step is required each time the write channels (e.g. 321-323) switch. During normal operation, signal Bias_En remains asserted.

Figure 4:
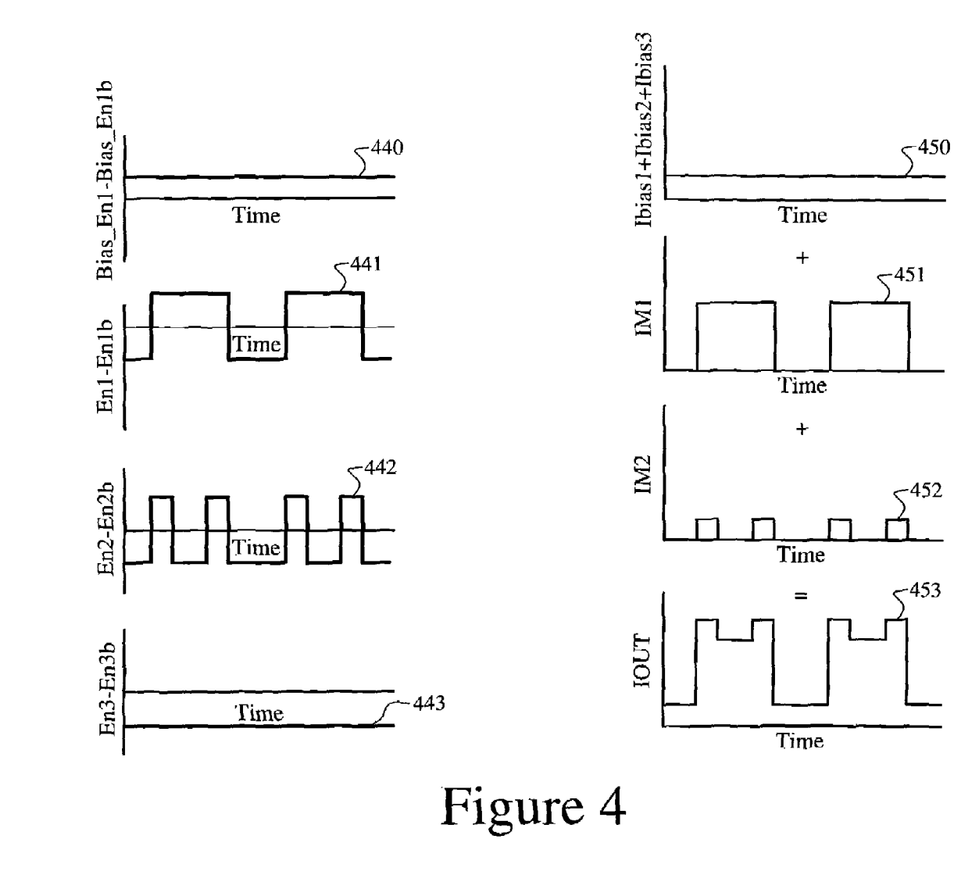
FIG. 4 illustrates timing diagrams of waveforms of embodiments of signals from FIG. 3.

FIG. 4 illustrates timing diagrams of waveforms of embodiments of signals from FIG. 3.

An arbitrary example of a shape for current IOUT is shown by waveform 453. This shape is obtained by switching write channels 321-323 with write enable signals as shown by waveforms 441-443. As previously discussed, signal Bias_En remains asserted throughout normal operation, as shown by waveform 440. The shape of current IOUT results from the contribution (bias currents, Ibias1-Ibias3) of read channel 330 as shown in waveform 450, and of the write channels (321 and 322), as shown by waveforms 451 and 452, respectively. Since signal En3 is de-asserted in the example shown, write channel 333 does not provide current to distributed current mirror 310.

Figure 5A:
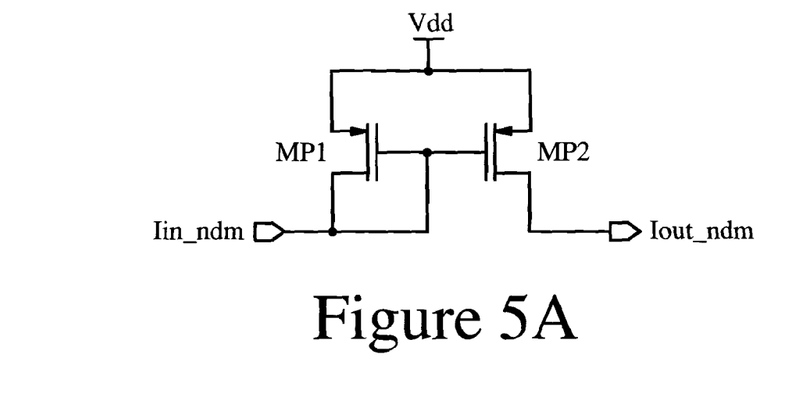
FIG. 5A shows a schematic diagram of a non-distributed current mirror.
Figure 5B:
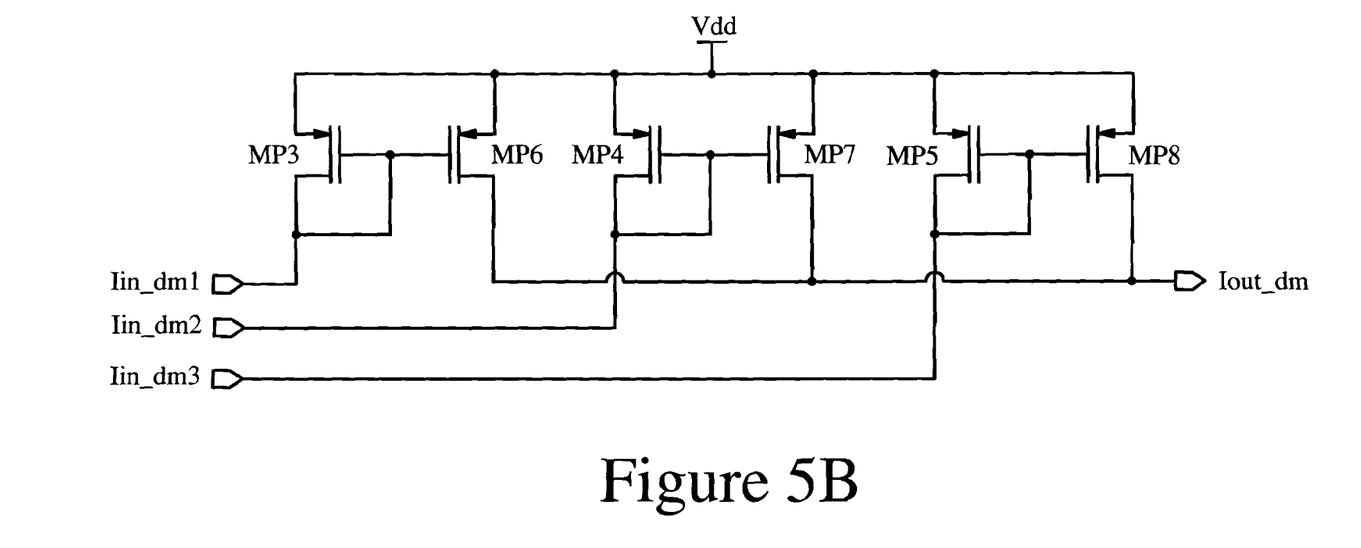
FIG. 5B schematically illustrates an embodiment of a distributed current mirror, in accordance with aspects of the invention.

Referring to FIGS. 5A and 5B, the relative difference in switching speed when a distributed current mirror (e.g. distributed current mirror 110 of FIG. 1) is employed in LDD circuit 100 of FIG. 1, rather than a non-distributed current mirror, is calculated. Current Iin_ndm is an input current for the non-distributed current mirror shown in FIG. 5A, and current Iout_ndm is the output current for the non-distributed current mirror shown in FIG. 5A. Currents Iin_dm1-Iin_dm3 are embodiments of currents IWC1-IWC3 respectively for a distributed current mirror, as illustrated in FIG. 5B. Similarly, current Iout_dm is an embodiment of output current IOUT for a distributed current mirror, as shown in FIG. 5B.

The calculations are based upon the following assumptions:

Assumptions:
1. The necessary output transistor size to deliver the maximum output current is known.
2. The input current of the output mirror is delivered to the output mirror by X+1 channels (one read channel (e.g. read channel 330 of FIG. 3) and X write channels).
3. All channels can be switched independently.

4. The total transistor sizes and the total current values are identical in both situations, so:

| assumptions | Explanation |
| --- | --- |
| equal total input current | Iin_ndm=Iin_dm1+Iin_dm2+Iin_dm3 |
| equal total output current | Iout_ndm=Iout_dm |
| equal total input transistor | MP1=MP3+MP4+MP5 |
| equal total output transistor | MP2=MP6+MP7+MP8 |

5. In the case of a non-distributed mirror (see FIG. 5A) all channels are connected to the same mirror input (Iin_ndm).

6. In the case of a distributed mirror (see FIG. 5B) each of the write channels are connected to a different mirror input (Iin_dm1, Iin_dm2, . . . ). The read channel is connected to all inputs.

To calculate the relative difference in switching speed, the assumptions above are used, together with the basic equations for a MOS transistor and a capacitor.

$$I_D = \frac{K}{2} \cdot \frac{W}{L} \cdot (V_{GS} - V_T)^2$$

$$I_G = C \cdot \frac{dV}{dt}$$

Step 1: First calculate the voltage step on the gate of the mirrors:

| Non-distributed mirror | Distributed mirror |
| --- | --- |
| $I_{D1} = \frac{K}{2} \cdot \frac{W}{L} \cdot (V_{GS1} - V_T)^2$ | $I_{D1} = \frac{K}{2} \cdot \frac{W}{X \cdot L} \cdot (V_{GS1} - V_T)^2$ |
| $I_{D2} = \frac{K}{2} \cdot \frac{W}{L} \cdot (V_{GS2} - V_T)^2$ | $I_{D2} = \frac{K}{2} \cdot \frac{W}{X \cdot L} \cdot (V_{GS2} - V_T)^2$ |
| $\Rightarrow dV = V_{GS2} - V_{GS1}$ | $dV = V_{GS2} - V_{GS1}$ |
| $\Rightarrow dV = \sqrt{2 \cdot \frac{I_{D2} \cdot L}{K \cdot W}} - \sqrt{2 \cdot \frac{I_{D1} \cdot L}{K \cdot W}}$ | $\Rightarrow dV = \sqrt{2 \cdot \frac{I_{D2} \cdot X \cdot L}{K \cdot W}} - \sqrt{2 \cdot \frac{I_{D1} \cdot X \cdot L}{K \cdot W}}$ |
| $\Rightarrow dV = \sqrt{2 \cdot \frac{L}{K \cdot W}} \cdot (\sqrt{I_{D2}} - \sqrt{I_{D1}})$ | $\Rightarrow dV = \sqrt{2 \cdot \frac{X \cdot L}{K \cdot W}} \cdot (\sqrt{I_{D2}} - \sqrt{I_{D1}})$ |
| $I_{D1} = I_1$ | $I_{D1} = \frac{I_1}{X}$ |
| $I_{D2} = I_1 + I_2$ | $I_{D2} = \frac{I_1}{X} + I_2$ |
| $\Rightarrow dV = \sqrt{2 \cdot \frac{L}{K \cdot W}} \cdot (\sqrt{I_1 + I_2} - \sqrt{I_1})$ | $\Rightarrow dV = \sqrt{2 \cdot \frac{L}{K \cdot W}} \cdot (\sqrt{I_1 + X \cdot I_2} - \sqrt{I_1})$ |

The "dV" voltage is the actual voltage step on the gate as a response to a step in the drain current from ID1 to ID2. The voltage step in the case of the distributed mirror will be larger, since the same step current is flowing through a smaller transistor.

For ease of calculation, the mirror is divided in "X" equal parts, although it is not necessary to do so.

Step 2: Calculate charging of gate capacitance:

Factors influencing the transient behavior include the current charging the gate capacitance, and the current flowing into the drain. These are continuously changing with the gate voltage. However, for the purposes of these calculations, it is not necessary to accurately calculate the transient behavior. Therefore in the calculation below, the current charging the gate capacitance is assumed to be equal to the initial gate current, which is equal to the step in the input current.

| Non-distributed mirror | Distributed mirror |
|---|---|
| $I_G = C_G \cdot \dfrac{dV}{dt}$ | $I_G = C_G \cdot \dfrac{dV}{dt}$ |
| $I_G = I_2$ | $I_G = I_2$ |
| $C_G = W \cdot L \cdot Csq$ | $C_G = \dfrac{W \cdot L \cdot Csq}{X}$ |
| $dV = \sqrt{2 \cdot \dfrac{L}{K \cdot W}} \cdot \left(\sqrt{I_1 + I_2} - \sqrt{I_1}\right)$ | $dV = \sqrt{2 \cdot \dfrac{L}{K \cdot W}} \cdot \left(\sqrt{I_1 + X \cdot I_2} - \sqrt{I_1}\right)$ |
| $\Rightarrow dt_{NDM} = W \cdot L \cdot Csq \cdot \dfrac{\sqrt{2 \cdot \dfrac{L}{K \cdot W}} \cdot \left(\sqrt{I_1 + I_2} - \sqrt{I_1}\right)}{I_2}$ | $\Rightarrow dt_{DM} = \dfrac{W \cdot L \cdot Csq}{X} \cdot \dfrac{\sqrt{2 \cdot \dfrac{L}{K \cdot W}} \cdot \left(\sqrt{I_1 + X \cdot I_2} - \sqrt{I_1}\right)}{I_2}$ |

By dividing the "dt" value for the distributed mirror by the value for the non-distributed mirror, the relative difference in switching speed can be calculated:

$$\frac{dt_{DM}}{dt_{NDM}} = \frac{1}{X} \cdot \frac{\left(\sqrt{I_1 + X \cdot I_2} - \sqrt{I_1}\right)}{\left(\sqrt{I_1 + I_2} - \sqrt{I_1}\right)}$$

The "dt" values that are calculated are the initial "dt" values, i.e. the values just after the step currents are applied.

Step 3: Calculate special cases

Since the relative difference in switching speed depends on the bias current, 3 special cases are shown.

| | $I_1 = 0$ | $I_1 = I_2$ | $I_1 = 2*I_2$ |
|---|---|---|---|
| $\dfrac{dt_{DM}}{dt_{NDM}}$ | $\dfrac{1}{\sqrt{X}}$ | $\dfrac{1}{X} \cdot \dfrac{\left(\sqrt{(X+1)} - 1\right)}{\left(\sqrt{2} - 1\right)}$ | $\dfrac{1}{X} \cdot \dfrac{\left(\sqrt{(X+2)} - \sqrt{2}\right)}{\left(\sqrt{3} - \sqrt{2}\right)}$ |

The number of current mirrors in current mirror 110 of FIG. 1 has a direct influence on the switching speed, as shown in the table below:

| X | $I_1 = 0$ | $I_1 = I_2$ | $I_1 = 2 * I_2$ |
|---|---|---|---|
| 1 | 1.000 | 1.000 | 1.000 |
| 2 | 0.707 | 0.884 | 0.922 |
| 3 | 0.577 | 0.805 | 0.862 |
| 4 | 0.500 | 0.746 | 0.814 |

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A laserdiode driver circuit, comprising:
a first laserdiode write channel including an output, wherein the first laserdiode write channel includes: a first adjustable current source circuit including an output;
a first current mirror including an output, and further including an input that is coupled to the output of the first laserdiode write channel;
a second laserdiode write channel including an output; and
a second current mirror including an input that is coupled to the output of the second laserdiode write channel, and further including an output that is coupled to the output of the first current mirror.

2. The circuit of claim 1, further comprising:
an output pin of an integrated circuit, wherein the integrated circuit includes the laserdiode driver circuit, the output pin is coupled to the output of the first current mirror and the output of the second current mirror, and wherein the output pin is arranged to provide an output current to a laserdiode.

3. The laserdiode driver circuit of claim 1, further comprising:
a third laserdiode write channel including an output; and
a third current mirror including an input that is coupled to the output of the third laserdiode write channel, and further including an output that is coupled to the output of the first current mirror and output of the second current mirror.

4. The laserdiode driver circuit of claim 1, further comprising:
a laserdiode that is coupled to the output of the first and second current mirrors.

5. The laserdiode driver circuit of claim 1, wherein the first laserdiode write channel further includes:
a first switch circuit that is coupled between the output of the first adjustable current source circuit and the input of the first current mirror; and
wherein the second laserdiode write channel includes:
a second adjustable current source circuit including an output; and a second switch circuit that is coupled between the output of the second adjustable current source circuit and the input of the second current mirror.

6. The laserdiode driver circuit of claim 5, wherein:
the first laserdiode write channel further includes a third switch circuit, wherein the first and third switch circuits are coupled together in a differential pair arrangement; and
the second laserdiode write channel further includes a fourth switch circuit, wherein the second and fourth switch circuits are coupled together in a differential pair arrangement.

7. The laserdiode driver circuit of claim 1, wherein
the first laserdiode write channel is arranged to, if a first write enable signal is asserted, provide a first write channel current that is based on a first write channel current control signal; and
the second laserdiode write channel is arranged to, if a second write enable signal is asserted, provide a second write channel current that is based on a second write channel current control signal.

8. The laserdiode driver circuit of claim 7, further comprising:
a first input pin of an integrated circuit, wherein the integrated circuit includes the laserdiode driver circuit;
an amplifier circuit that is arranged to provide the first write enable signal based on a first input signal at the first input pin;
a second input pin of the integrated circuit; and
another amplifier circuit that is arranged to provide the second write enable signal based on a second input signal at the second input pin.

9. A laserdiode driver circuit, comprising:
a first laserdiode write channel including an output;
a first current mirror including an output, and further including an input that is coupled to the output of the first laserdiode write channel;
a second laserdiode write channel including an output; and
a second current mirror including an input that is coupled to the output of the second laserdiode write channel, and further including an output that is coupled to the output of the first current mirror, wherein
the first laserdiode write channel is arranged to, if a first write enable signal is asserted, provide a first write channel current that is based on a first write channel current control signal; and
the second laserdiode write channel is arranged to, if a second write enable signal is asserted, provide a second write channel current that is based on a second write channel current control signal, and
wherein the first laserdiode write channel includes:
a first transistor that includes a gate that is arranged to receive the first write enable signal, a drain that is coupled to the input of the first current mirror, and a source;
a second transistor including a source that is coupled to the source of the first transistor; and
a third transistor including a drain that is coupled to the source of the first transistor, wherein the third transistor is arranged to receive the first write current control signal; and
wherein the second laserdiode write channel includes:
a fourth transistor that includes a gate that is arranged to receive the second write enable signal, a drain that is coupled to the input of the second current mirror, and a source;

a fifth transistor including a source that is coupled to the source of the fourth transistor; and
a sixth transistor including a drain that is coupled to the source of the fourth transistor, wherein the sixth transistor is arranged to receive the second write current control signal.

10. A laserdiode driver circuit, comprising:
a first adjustable current source circuit including an output;
a first current mirror including an input and an output;
a first switch circuit that is coupled between the output of the first adjustable current source circuit and the input of the first current mirror;
a second adjustable current source circuit including an output;
a second current mirror including an input and an output;
a second switch circuit that is coupled between the output of the second adjustable current source circuit and the input of the second current mirror;
a first bias current source circuit including an output;
a first bias current switch circuit that is coupled between the output of the first bias current source and the input of the first current mirror;
a second bias current source circuit including an output, wherein the second bias current source circuit is coupled to the first bias current source circuit; and
a second bias current switch circuit that is coupled between the output of the second bias current source the input of the second current mirror.

11. The laserdiode driver circuit of claim 10, further comprising:
a third adjustable current source circuit including an output;
a third current mirror including an input and an output;
a third switch circuit that is coupled between the output of the third adjustable current source circuit and the input of the third current mirror;
a third bias current source circuit including an output, wherein the third bias current source circuit is coupled to the first and second bias current source circuits; and
a third bias current switch circuit that is coupled between the output of the third bias current source the input of the third current mirror.

12. The laserdiode driver circuit of claim 10, further comprising:
an output pin of an integrated circuit, wherein the integrated circuit includes the laserdiode driver circuit, and wherein the output pin is coupled to the output of the first and second current mirrors.

13. The laserdiode driver circuit of claim 12, further comprising:
a third switch circuit, wherein the first and third switch circuits are coupled together in a differential pair arrangement;
a fourth switch circuit, wherein the second and fourth switch circuits are coupled together in a differential pair arrangement;
a fifth switch circuit, wherein the fifth switch circuit and the first bias current switch circuit are coupled together in a differential pair arrangement; and
a sixth switch circuit, wherein the sixth switch circuit and the second bias current switch circuit are coupled together in a differential pair arrangement.

14. A method for driving a laserdiode, comprising:
providing a first write channel current to a first current mirror if a first write channel enable signal is asserted;

employing a first adjustable current source circuit to adjust the first write channel current;

employing the first current mirror to provide a first mirror output current based, in part, on the first write channel current;

providing a second write channel current to a second current mirror if a second write channel enable signal is asserted;

employing the second current mirror to provide a second mirror output current based, in part, on the second write channel current;

providing a laserdiode current to the laserdiode by combining at least the first mirror output current and the second mirror output current.

15. The method of claim 14, further comprising:

providing a third write channel current to a third current mirror if a third write channel enable signal is asserted; and employing the third current mirror to provide a third mirror output current based, in part, on the third write channel current, wherein providing the laserdiode current is further accomplished by combining the third mirror output current with the first and second mirror output currents.

16. The method of claim 14, further comprising:

providing a first bias current to the first current mirror; and providing a second bias current to the second current mirror.

17. The circuit of claim 14, further comprising:

employing the laserdiode to write to an optical disc.

18. The circuit of claim 14, wherein providing the first write channel current is accomplished such that the first write channel current is based, in part, on a first write current control signal; and wherein providing the second write channel current is accomplished such that the second write channel current is based, in part, on a second write channel control signal.

19. A laserdiode driver circuit, comprising:

a first write channel including an output;

a first current mirror including an input and an output;

a second write channel including an output;

a second current mirror including an input and an output, wherein the output of the second current mirror is coupled to the output of the first current mirror; and a read channel including:

a first bias current source circuit including an output; and a second bias current source circuit including an output, wherein the second bias current source circuit is coupled to the first bias current source circuit.

20. The circuit of claim 19, wherein the read channel further includes:

a first bias current switch circuit that is coupled between the output of the first bias current source and the input of the first current mirror.

* * * * *

UNITED STATES PATENT AND TRADEMARK OFFICE
CERTIFICATE OF CORRECTION

PATENT NO.       : 7,272,159 B1
APPLICATION NO.  : 11/007890
DATED            : September 18, 2007
INVENTOR(S)      : Stegers et al.

It is certified that error appears in the above-identified patent and that said Letters Patent is hereby corrected as shown below:

In column 1, line 53, after "FIG. 3" delete "," and insert -- ; --, therefor.

In column 4, line 35, after "currents" delete ",".

In column 6, line 27 (Below Non-Distributed mirror), after "$\Rightarrow dV=V_{GS2} - V_{GS1}$" delete "$dV=V_{GS2} - V_{GS1}$" and insert -- $\Rightarrow dV=V_{GS2} - V_{GS1}$ --, therefor.

In column 7, line 37, after "cases" insert -- : --.

In column 7, line 55, delete "$I_1=2 * 1_2$" and insert -- $I_1=2*I_2$ --, therefor.

Signed and Sealed this

Eighteenth Day of December, 2007

JON W. DUDAS
*Director of the United States Patent and Trademark Office*